(12) United States Patent
Klett et al.

(10) Patent No.: US 11,916,537 B2
(45) Date of Patent: Feb. 27, 2024

(54) ELECTROACOUSTIC DEVICE WITH CONDUCTIVE ACOUSTIC MIRRORS

(71) Applicant: RF360 SINGAPORE PTE. LTD., Singapore (SG)

(72) Inventors: Joachim Klett, Grafing bei München (DE); Thomas Mittermaier, Bavaria (DE)

(73) Assignee: RF360 Singapore Pte. Ltd., Singapore (SG)

( * ) Notice: Subject to any disclaimer, the term of this patent is extended or adjusted under 35 U.S.C. 154(b) by 341 days.

(21) Appl. No.: 17/459,325

(22) Filed: Aug. 27, 2021

(65) Prior Publication Data

US 2022/0131523 A1 Apr. 28, 2022

Related U.S. Application Data

(60) Provisional application No. 63/106,727, filed on Oct. 28, 2020.

(51) Int. Cl.
*H03H 9/17* (2006.01)
*H03H 9/13* (2006.01)
*H03H 9/56* (2006.01)
*H03H 3/02* (2006.01)

(52) U.S. Cl.
CPC ............... *H03H 9/17* (2013.01); *H03H 3/02* (2013.01); *H03H 9/13* (2013.01); *H03H 9/568* (2013.01); *H03H 2003/025* (2013.01)

(58) Field of Classification Search
None
See application file for complete search history.

(56) References Cited

U.S. PATENT DOCUMENTS

| 2009/0059464 | A1 | 3/2009 | McKinzie, III |
| 2019/0267361 | A1 | 8/2019 | Rahim et al. |
| 2021/0250012 | A1* | 8/2021 | Hou ........................ H03H 9/08 |
| 2021/0399716 | A1* | 12/2021 | Yu ........................ H03H 9/0514 |
| 2022/0103239 | A1* | 3/2022 | Shealy .................... H03F 3/195 |

FOREIGN PATENT DOCUMENTS

WO 2018111532 6/2018

OTHER PUBLICATIONS

International Search Report and Written Opinion—PCT/EP2021/074323—ISA/EPO—dated Jan. 11, 2022.
Klett J., et al., "Method for Manufacturing Conductive Acoustic Mirrors for Baw Application with Low TCF", Feb. 27, 2020, 3 pages.

* cited by examiner

*Primary Examiner* — Kenneth B Wells
(74) *Attorney, Agent, or Firm* — Patterson + Sheridan LLP

(57) ABSTRACT

Certain aspects of the present disclosure can be implemented in an electroacoustic device. The electroacoustic device generally includes: a substrate; a bottom electrode layer disposed above the substrate; an acoustic mirror stack having a dielectric layer disposed above the bottom electrode layer and a conductive layer disposed above the dielectric layer; a piezoelectric layer disposed above the acoustic mirror stack; and one or more vias disposed between the bottom electrode layer and the conductive layer, the one or more vias electrically coupling the bottom electrode layer and the conductive layer.

27 Claims, 9 Drawing Sheets

ELECTROACOUSTIC DEVICE WITH CONDUCTIVE ACOUSTIC MIRRORS

CROSS-REFERENCE TO RELATED APPLICATION

This application claims benefit of and priority to U.S. Provisional Application No. 63/106,727 filed Oct. 28, 2020, which is hereby expressly incorporated by reference herein in its entirety as if fully set forth below and for all applicable purposes.

BACKGROUND

Field of the Disclosure

Aspects of the present disclosure relate to electronic devices, and more particularly, to an electroacoustic device.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. Wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., IEEE 802.11), and the like.

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 500 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

As the number of frequency bands used in wireless communications increases and as the desired frequency band of filters widen, the performance of acoustic filters increases in importance to reduce resistive losses, increase attenuation of out-of-band signals, and increase overall performance of electronic devices. Acoustic filters with improved performance are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include desirable performance from a bulk acoustic wave (BAW) resonator at high operating powers due to the heat dissipation provided by the substrate described herein.

Certain aspects of the present disclosure can be implemented in an electroacoustic device. The electroacoustic device generally includes: a substrate; a bottom electrode layer disposed above the substrate; an acoustic mirror stack having a first dielectric layer disposed above the bottom electrode layer and a first conductive layer disposed above the first dielectric layer; a piezoelectric layer disposed above the acoustic mirror stack; and one or more first vias disposed between the bottom electrode layer and the first conductive layer, the one or more first vias electrically coupling the bottom electrode layer and the first conductive layer.

Certain aspects of the present disclosure can be implemented in a method for signal processing. The method generally includes receiving a signal at a terminal of an electroacoustic device and processing the signal via the electroacoustic device. The electroacoustic device comprises: a substrate; a bottom electrode layer disposed above the substrate; an acoustic mirror stack having a first dielectric layer disposed above the bottom electrode layer and a first conductive layer disposed above the first dielectric layer; a piezoelectric layer disposed above the acoustic mirror stack; and one or more first vias disposed between the bottom electrode layer and the first conductive layer, the one or more first vias electrically coupling the bottom electrode layer and the first conductive layer.

Certain aspects of the present disclosure are directed to a method of fabricating an electroacoustic device. The method generally includes forming a bottom electrode layer above a substrate; forming an acoustic mirror stack comprising: (a) a first dielectric layer disposed above the bottom electrode layer; and (b) a first conductive layer disposed above the first dielectric layer; forming one or more first vias electrically coupled between the bottom electrode layer and the first conductive layer; and forming a piezoelectric layer above the acoustic mirror stack.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide an electroacoustic device having vias through reflective layers of an acoustic mirror, allowing a bottom electrode (BE) of the electroacoustic device to be implemented below the reflective layers.

Electroacoustic devices such as bulk acoustic wave (BAW) resonators, which employ a piezoelectric material arranged between electrode structures, are being designed to cover more frequency ranges (e.g., 500 MHz to 7 GHz), to have higher bandwidths (e.g., up to 20%), and to have improved efficiency and performance. In general, a BAW resonator is an electromechanical device in which a standing acoustic wave is generated by an electrical signal in the bulk of a piezoelectric material arranged between electrodes to which the electrical signal is applied. One type of BAW resonator is referred to as a thin-film BAW resonator (FBAR). An FBAR may include piezoelectric material manufactured by thin film methods sandwiched between two electrodes and acoustically isolated from the surrounding medium. A solidly mounted resonator (SMR) is a type of BAW resonator having a piezoelectric thin film sandwiched between two electrodes and a Bragg reflector having alternating high and low acoustic impedance layers of quarter-wavelength thickness.

In some implementations (e.g., using an SMR), the BE is implemented between one or more reflector layers and the piezoelectric layer. The BE may be implemented as a relatively thin layer. Thus, electric loss associated with the thin BE may degrade the performance and power durability of the electroacoustic device. In other words, connection to the BE may be primarily realized through aluminum copper (AlCu) and may be implemented as a relatively thin layer because Al is an acoustically lossy material. Self-heating of the electroacoustic device further increases resistance of the BE.

Certain aspects of the present disclosure are directed to techniques for implementing the BE below the reflector layers, allowing the thickness of the BE to be increased as compared to conventional implementations. Increasing the thickness of the BE reduces the resistivity of the BE, improving the performance and power durability of the electroacoustic device. The electroacoustic device provided herein lowers electric and acoustic losses, provides higher acoustic reflection, and lowers the temperature coefficient of frequency (TCF) and electrical conduction of the electroacoustic device, as compared to conventional implementations. Electrical coupling between the BE and the piezoelectric layer may be facilitated by vias through the reflector layers, as described in more detail herein.

Example Electroacoustic Device

Figure 1A:
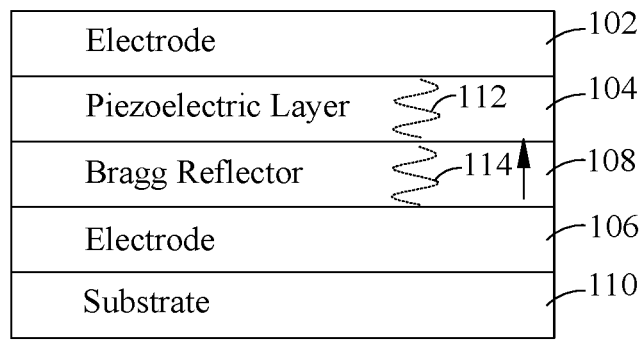
FIG. 1A is a diagram conceptually illustrating an example electroacoustic device, in accordance with certain aspects of the present disclosure.

FIG. 1A illustrates a conceptual cross-section of an example electroacoustic device 100, in accordance with certain aspects of the present disclosure. The electroacoustic device 100 may be configured as or be a portion of a BAW resonator. In certain cases, a wireless communication apparatus may include the BAW resonator, for example, as further described herein with respect to FIGS. 3, 6, 7, and 8.

As shown, the electroacoustic device 100 includes an electrode structure 102 (e.g., also referred to as top electrode (TE)), a piezoelectric layer 104, an electrode structure 106 (e.g., also referred to a bottom electrode (BE)), one or more reflector layers 108, and a substrate 110. In certain aspects of the present disclosure, the one or more reflector layers 108 may be disposed between the electrode structure 106 and the piezoelectric layer 104. One or more vias (not shown in FIG. 1A) may be implemented through the one or more reflector layers 108, allowing electrical extension of the electrode structure 106 to the piezoelectric layer 104.

The electrode structure 102 may be disposed above the piezoelectric layer 104. The electrode structure 102 may include an electrically conductive material such as a metal or metal alloy including aluminum (Al), chromium (Cr), cobalt (Co), copper (Cu), gold (Au), molybdenum (Mo), platinum (Pt), ruthenium (Ru), tantalum (Ta), titanium (Ti), tungsten (W), a combination thereof (e.g., AlCu), or any other suitable material. In certain cases, the conductive material may include graphene or other electrically conductive, non-metallic materials. The piezoelectric layer 104 may include a piezoelectric material such as aluminum nitride (AlN), zinc oxide (ZnO), a quartz crystal (such as lithium tantalate (LiTaO$_3$) or lithium niobite (LiNbO$_3$)), doped variants of these, or other suitable piezoelectric materials.

The electrode structure 106 may include an electrically conductive material such as a metal or metal alloy, for example, as described herein with respect to the electrode structure 102. In certain aspects, the electrode structure 106 may have the same form, size, and structure as the electrode structure 102. For example, the electrode structures 102, 106 may both be electrode plates. In certain cases, the electrode structure 106 may have a different form, size, or structure as the electrode structure 102.

The one or more reflector layers 108 may serve as a Bragg reflector to acoustically isolate the BAW resonator from the substrate 110 or at least reduce the acoustic coupling between the BAW resonator and the substrate 110. In general, the one or more reflector layers 108 may include alternating layers of materials having low acoustic impedance and materials having high acoustic impedance, as further described herein with respect to FIG. 1B.

The substrate 110 may be disposed below the one or more reflector layers 108, such that the substrate 110 is arranged under the electrode structure 102 and the electrode structure 106. The substrate 110 may serve as a carrier for the BAW resonator. In aspects, the substrate 110 may be formed from a semiconductor wafer such as a silicon (Si) wafer. The substrate 110 may comprise any of various other suitable materials, such as alumina, glass, or sapphire.

An electrical signal excited between the electrode structures 102 and 106 (e.g., applying an AC voltage) is transformed into an acoustic wave 112 that propagates in the piezoelectric layer 104. That is, applying an electrical signal to the piezoelectric layer 104 through the electrode structures 102 and 106 transduces the electrical signal to the acoustic wave 112 in the piezoelectric layer 104. At certain frequencies, a resonant or anti-resonant mechanical standing wave may be formed, thus enabling the filter functionality. To avoid leakage into the substrate, reflector layers may be disposed below the electroacoustic resonator. The one or more reflector layers 108 may also reflect an acoustic wave 114 back towards the piezoelectric layer 104 and the electrode structure 102 with high acoustic reflectivity. Reflecting the acoustic waves 114 may enhance the efficiency of the BAW resonator and acoustically decouple the substrate 110 from the BAW resonator. In many applications, the piezoelectric layer 104 has a particular crystal orientation such that when the electrode structure 102 is arranged relative to the crystal orientation of the piezoelectric layer 104, the acoustic wave mainly propagates in a direction from the electrode structure 102 to the electrode structure 106.

Figure 1B:
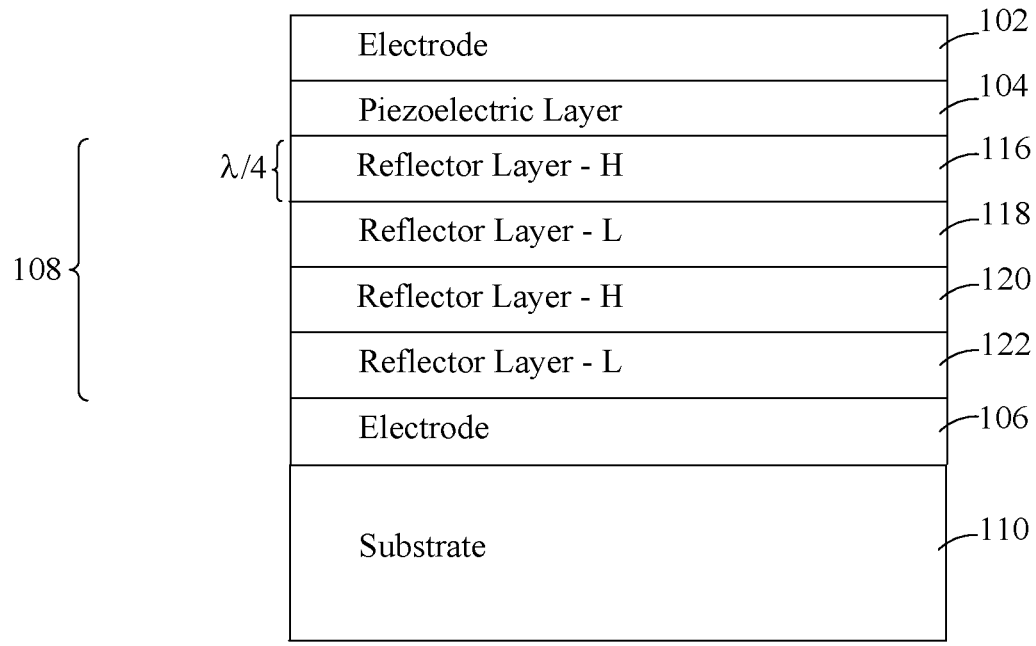
FIG. 1B is a diagram illustrating a cross-section of the example electroacoustic device of FIG. 1A, in accordance with certain aspects of the present disclosure.

FIG. 1B illustrates example layers of the one or more reflector layers 108 of the electroacoustic device 100, in accordance with certain aspects of the present disclosure.

In this example, the one or more reflector layers 108 include a reflector layer 116, a reflector layer 118, a reflector layer 120, and a reflector layer 122. In certain cases, the one or more reflector layers 108 may have any suitable number of reflector layers, such as fewer or more than four reflector layers as depicted in this example. The reflector layer 116 and reflector layer 120 may include a material having an acoustic impedance that is higher than the acoustic impedance of a material of the reflector layer 118 and reflector layer 122. For example, the reflector layer 118 and reflector layer 122 may include silicon dioxide (SiO₂), whereas the reflector layer 116 and reflector layer 120 may include tungsten (W) or other suitable materials with a higher acoustic impedance than silicon dioxide or aluminum nitride.

The one or more reflector layers 108 may have the same thickness (e.g., a quarter wavelength (λ/4) in thickness according to the operating frequency range of the electroacoustic device 100) or vary in thickness. While in this example, the one or more reflector layers 108 are depicted as having the same length, the one or more reflector layers 108 may vary in length (i.e., individual layers may have different lengths).

Figure 2:
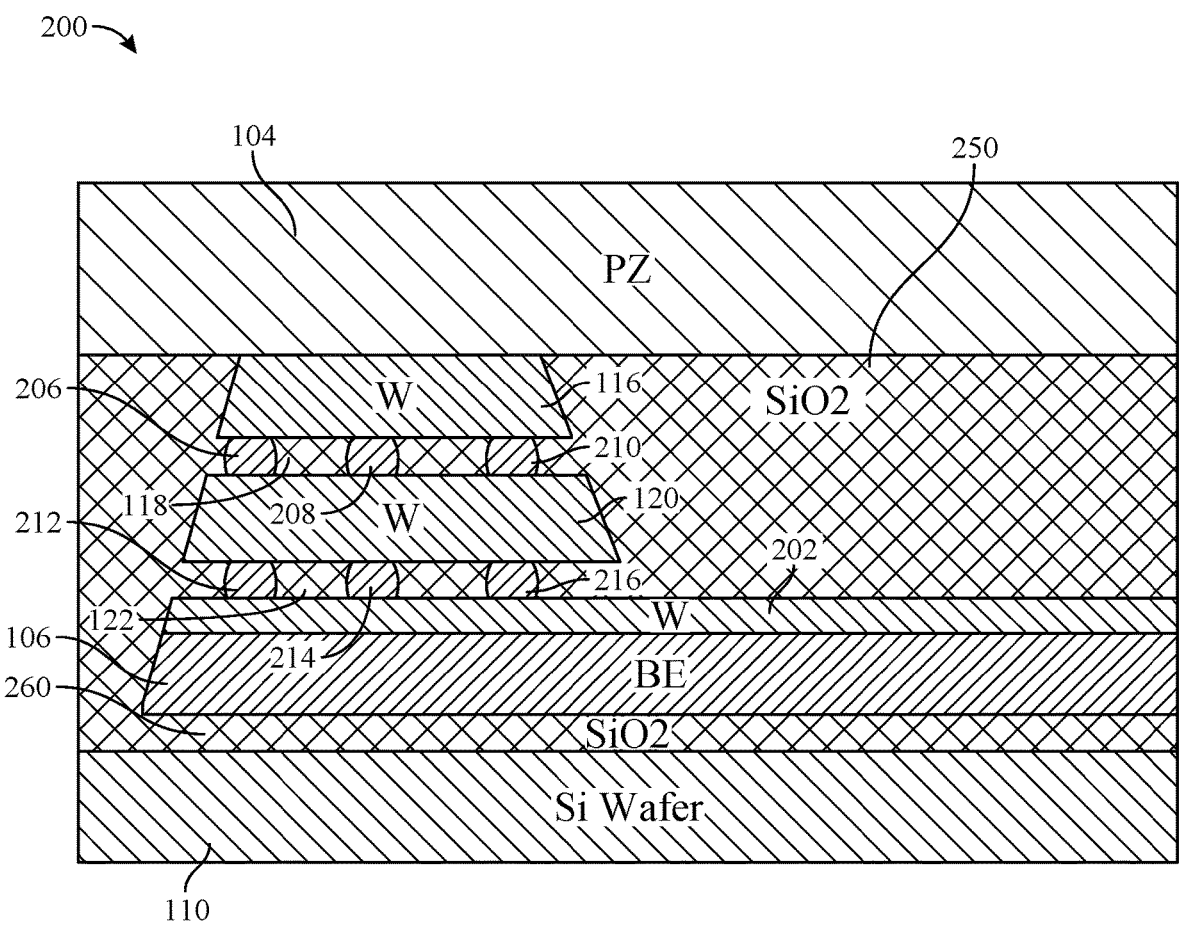
FIG. 2 illustrates a cross-section of an example electroacoustic device implemented with vias through reflector layers, in accordance with certain aspects of the present disclosure.

FIG. 2 illustrates a cross-section of an example electroacoustic device 200 implemented with vias through the reflector layers, in accordance with certain aspects of the present disclosure. The electroacoustic device 200 may include a dielectric region 250 (e.g., composed of SiO₂), where the reflector layers 118, 122 are portions of the dielectric region 250, as illustrated. Moreover, a dielectric layer 260 (e.g., of SiO₂) may be included between the electrode structure 106 and the substrate 110 (e.g., a portion of a silicon (Si) wafer). The electroacoustic device may include vias 206, 208, 210 through reflector layer 118. While FIG. 2 illustrates three vias through each layer (e.g., reflector layer 122) to facilitate understanding, any number of vias less than three or greater than three may be implemented. Since the reflector layer 118 is implemented using a dielectric (e.g., SiO₂), the vias 206, 208, 210 through the reflector layer 118 facilitate electric coupling between the reflector layers 116, 120 that are implemented using conductive material (e.g., W). In some aspects, vias 212, 214, 216 may also be formed through reflector layer 122 (e.g., also composed of SiO₂) to facilitate electric coupling between the electrode structure 106 and the reflector layer 120. Optionally, a reflector layer 202 may be implemented between the electrode structure 106 and the reflector layer 122, as illustrated.

With the formation of vias 206, 208, 210, 212, 214, 216, the electrode structure 106 may be implemented below the reflector layers, allowing the electrode structure 106 to be implemented as a thicker electrode layer as compared to conventional implementations where the electrode structure is implemented above reflector layers. For instance, the electrode structure 106 may have a thickness that is greater than 100 nm (e.g., 1000 nm), reducing the resistivity of the electrode structure 106 as compared to conventional implementations.

Figure 3:
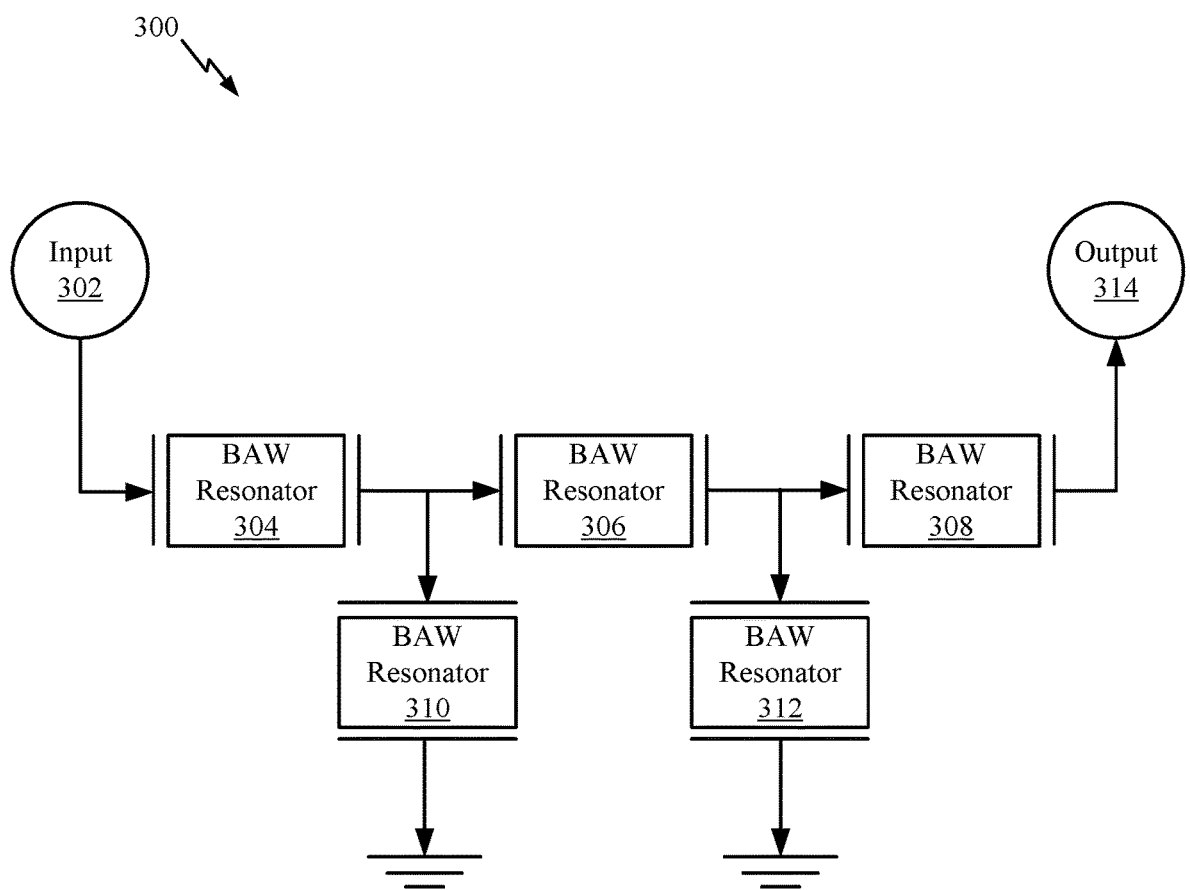
FIG. 3 is a schematic diagram of an example electroacoustic filter circuit that may include the electroacoustic device of FIG. 2, in accordance with certain aspects of the present disclosure.

FIG. 3 is a schematic diagram of an electroacoustic filter circuit 300 that may include the electroacoustic device 200, in accordance with certain aspects of the present disclosure. The filter circuit 300 provides one example of where the electroacoustic device 200 may be used. The filter circuit 300 includes an input terminal 302 and an output terminal 314. Between the input terminal 302 and the output terminal 314, a ladder-type network of electroacoustic devices (e.g., BAW resonators) is provided. The filter circuit 300 includes a first BAW resonator 304, a second BAW resonator 306, and a third BAW resonator 308 all electrically connected in series between the input terminal 302 and the output terminal 314. A fourth BAW resonator 310 (e.g., shunt resonator) has a first terminal connected between the first BAW resonator 304 and the second BAW resonator 306 and a second terminal connected to a ground potential node. A fifth BAW resonator 312 (e.g., shunt resonator) has a first terminal connected between the second BAW resonator 306 and the third BAW resonator 308 and a second terminal connected to the ground potential node. The electroacoustic filter circuit 300 may, for example, be a bandpass circuit having a passband with a selected frequency range (e.g., in a frequency range between 500 MHz and 7 GHz).

Figure 4A:
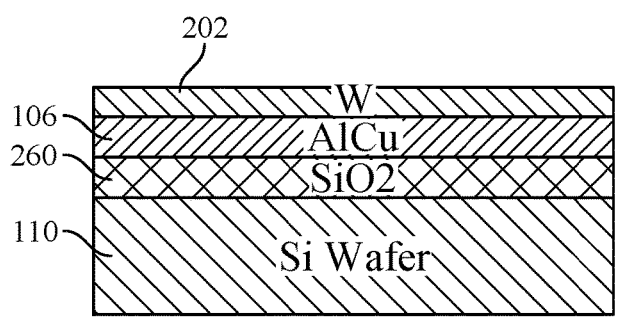
FIGS. 4A to 4I illustrate example operations for fabricating an electroacoustic device, in accordance with certain aspects of the present disclosure.
Figure 4B:
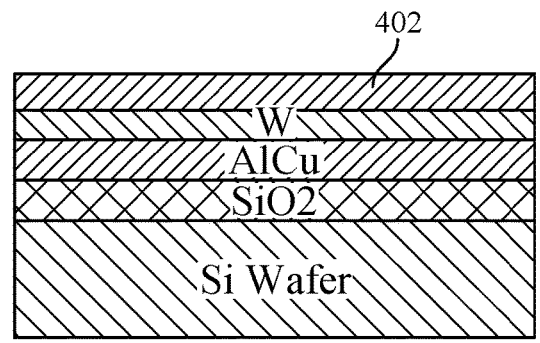
Figure 4C:
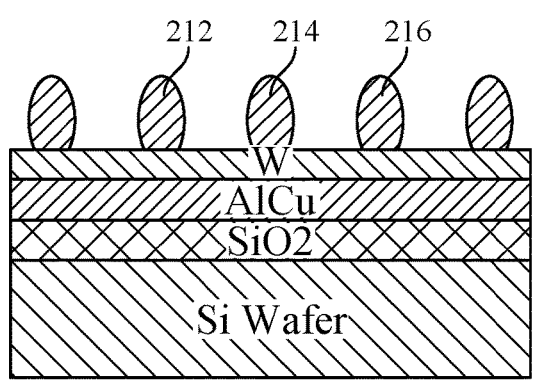
Figure 4D:
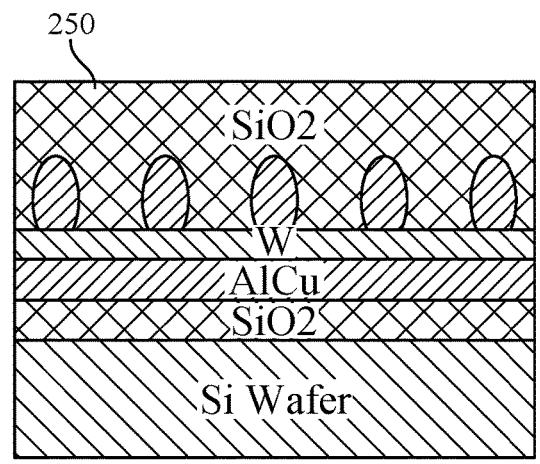
Figure 4E:
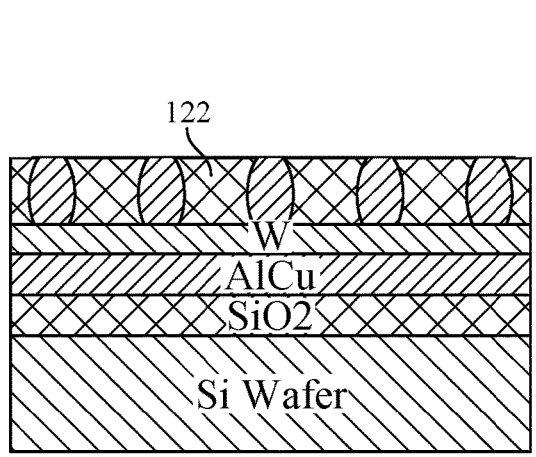
Figure 4F:
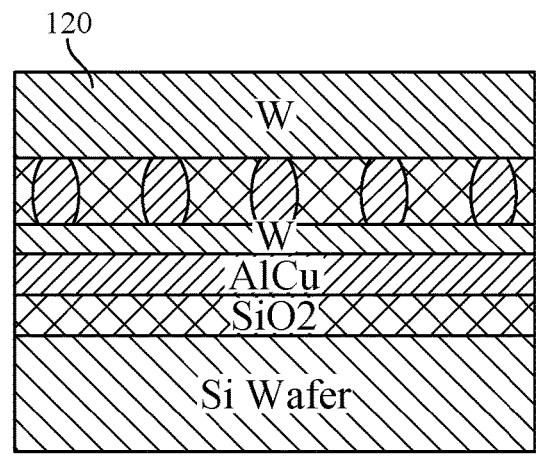
Figure 4G:
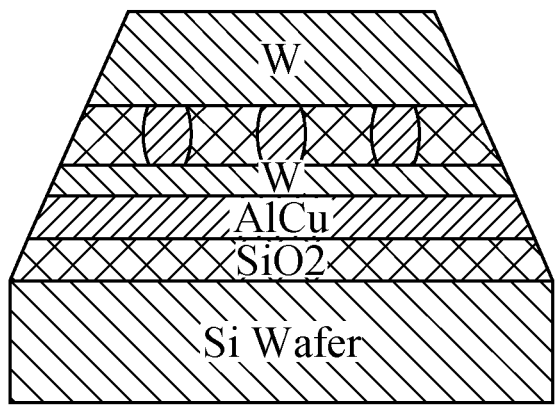
Figure 4H:
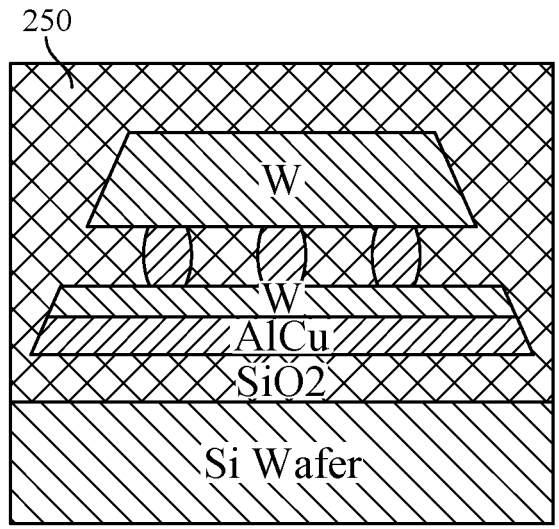
Figure 4I:
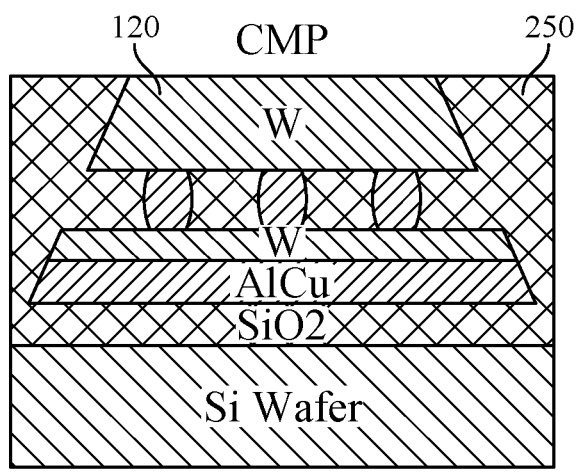

FIGS. 4A to 4I illustrate example operations for fabricating the electroacoustic device 200, in accordance with certain aspects of the present disclosure. As illustrated in FIG. 4A, the dielectric layer 260 (e.g., composed of SiO₂), the electrode structure 106 (e.g., composed of AlCu), and the reflector layer 202 (e.g., composed of W) may be formed above the substrate 110 (e.g., a portion of a Si wafer). As illustrated in FIG. 4B, a conductive layer 402 (e.g., composed of W) may be formed above the reflector layer 202, and this conductive layer 402 may be used to form vias 212, 214, 216 using lithography or self-assembly as illustrated in FIG. 4C. A portion of the dielectric region 250 (e.g., composed of SiO$_2$) may then be formed above the vias 212, 214, 216 and the reflector layer 202, as illustrated in FIG. 4D. As illustrated in FIG. 4E, chemical-mechanical polishing (CMP) or other suitable removal technique may be performed on the dielectric region 250 until a top surface of the dielectric region 250 is the same level as an upper portion of vias 212, 214, 216 as shown. The reflector layer 120 may be then formed above the leveled surface, as illustrated in FIG. 4F. As illustrated in FIG. 4G, the layer stack may be etched to form the tapered structure as shown. Another portion of the dielectric region 250 may be then deposited or otherwise formed, as illustrated in FIG. 4H, followed by CMP of the dielectric region 250 such that the upper surface of the dielectric region 250 is at the same level as the top surface of reflector layer 120, as illustrated in FIG. 4I. This process may be repeated to form additional reflective layers as shown in FIG. 2 prior to formation of the piezoelectric layer above the reflective layers.

Figure 5:
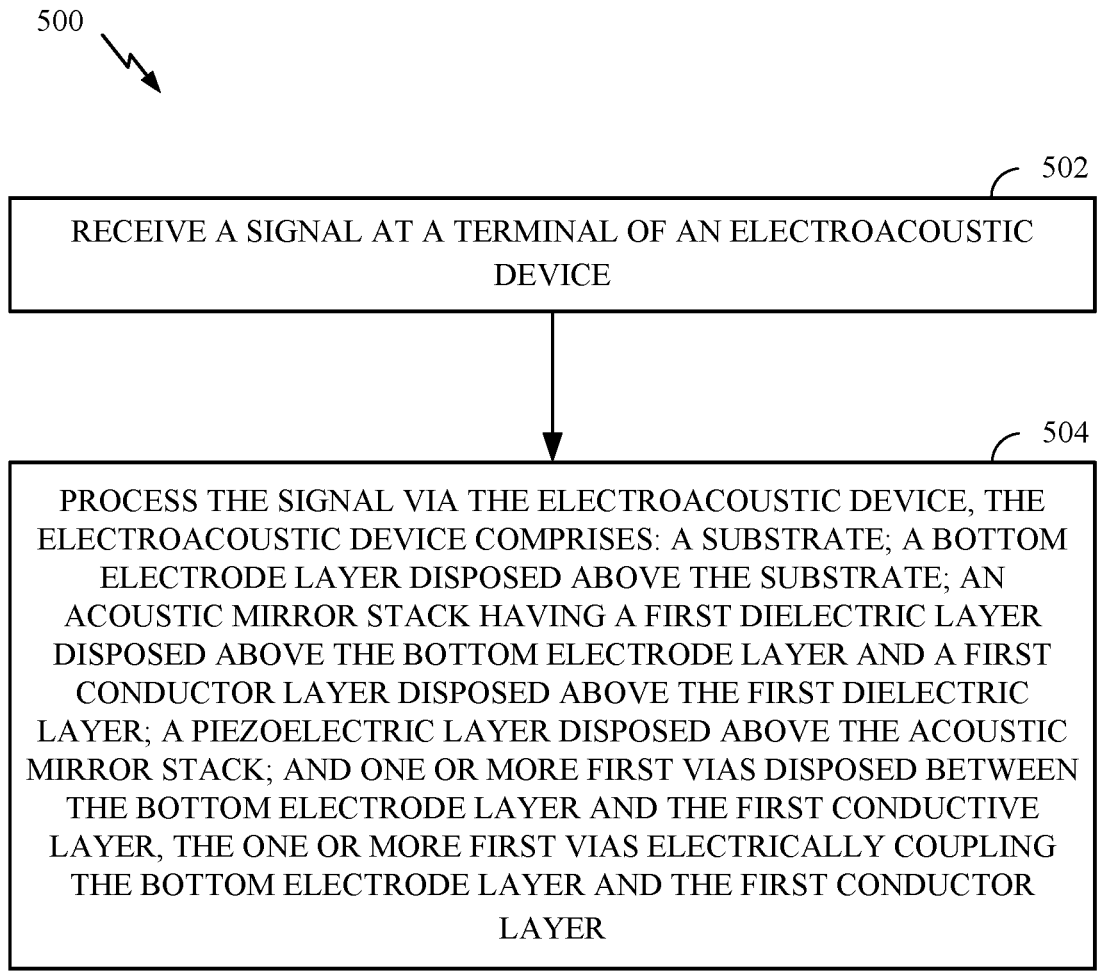
FIG. 5 is a flow diagram illustrating example operations for signal processing, in accordance with certain aspects of the present disclosure.

FIG. 5 is a flow diagram illustrating example operations 500 for signal processing, in accordance with certain aspects of the present disclosure. The operations 500 may be performed, for example, by an electroacoustic device such as the electroacoustic device 200 (e.g., a BAW resonator).

The operations 500 may begin, at block 502, with the electroacoustic device receiving a signal at a terminal (e.g., an electrode) of the electroacoustic device. At block 504, the electroacoustic device processes the signal. The electroacoustic device may include a substrate (e.g., substrate 110), a bottom electrode layer (e.g., electrode structure 106) disposed above the substrate, and an acoustic mirror stack. The acoustic mirror stack may include a first dielectric layer (e.g., reflector layer 122) disposed above the bottom electrode layer, and a first conductive layer (e.g., reflector layer 120) disposed above the first dielectric layer. In certain aspects, the electroacoustic device may include a piezoelectric layer (e.g., piezoelectric layer 104) disposed above the acoustic mirror stack, and one or more first vias (e.g., vias 212, 214, 216) disposed between the bottom electrode layer and the first conductive layer, the one or more first vias electrically coupling the bottom electrode layer and the first conductive layer.

In some aspects, the terminal of the electroacoustic device at which the signal is received may be the bottom electrode layer. In some aspects, the electroacoustic device may include a top electrode layer (e.g., electrode structure 102) disposed above the piezoelectric layer. In some cases, the terminal of the electroacoustic device at which the signal is received may be the top electrode layer.

In some aspects, the acoustic mirror stack may include one or more second dielectric layers (e.g., reflector layer 118) disposed above the bottom electrode layer, one or more second conductive layers (e.g., reflector layer 116), each disposed above a respective one of the one or more second dielectric layers, and one or more second vias (e.g., vias 206, 208, 210) disposed between the first conductive layer and a respective one of the one or more second conductive layers. The one or more second vias may electrically couple the first conductive layer and the respective one of the one or more second conductive layers. In some aspects, the piezoelectric layer may be in direct contact with an uppermost conductive layer (e.g., reflector layer 116) of the one or more second conductive layers. In some aspects, the piezoelectric layer may be in direct contact with the first conductive layer.

In certain aspects, the electroacoustic device may also include a second conductive layer (e.g., reflector layer 202) coupled between the bottom electrode layer and the first dielectric layer. The first conductive layer may include tungsten (W). In some aspects, the one or more first vias comprise aluminum (Al) or aluminum copper (AlCu), W, Mo, or any other suitable material. In certain aspects, the electroacoustic device may include a second dielectric layer (e.g., dielectric layer 260) between the substrate and the bottom electrode layer. In some implementations, a thickness of the bottom electrode layer may be greater than 100 nanometers.

Figure 6:
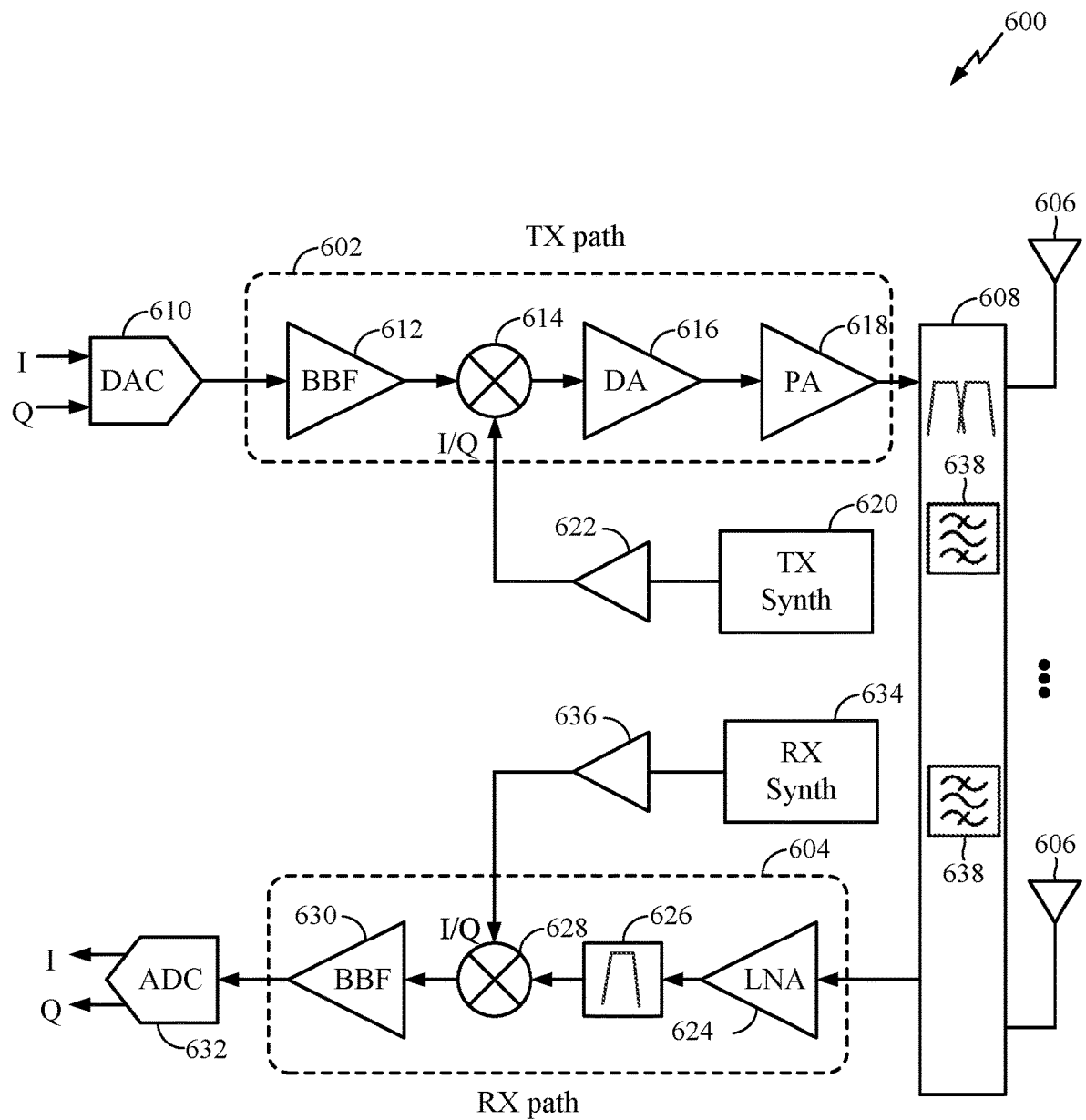
FIG. 6 is a diagram of an example transceiver in which the electroacoustic filter of FIG. 3 may be employed, in accordance with certain aspects of the present disclosure.

FIG. 6 is a block diagram of an example RF transceiver 600, in accordance with certain aspects of the present disclosure. In certain aspects, the electroacoustic device described herein may be employed in various circuits (such as an RF transceiver), for example, to serve as an electroacoustic filter or duplexer. The RF transceiver 600 includes at least one transmit (TX) path 602 (also known as a transmit chain) for transmitting signals via one or more antennas 606 and at least one receive (RX) path 604 (also known as a receive chain) for receiving signals via the antennas 606. When the TX path 602 and the RX path 604 share an antenna 606, the paths may be connected with the antenna via an interface 608, which may include any of various suitable RF devices, such as an electroacoustic filter 638 (e.g., the electroacoustic filter circuit 300), a duplexer (which may include a BAW resonator), a diplexer, a multiplexer, and the like.

Receiving in-phase (I) or quadrature (Q) baseband analog signals from a digital-to-analog converter (DAC) 610, the TX path 602 may include a baseband filter (BBF) 612, a mixer 614, a driver amplifier (DA) 616, and a power amplifier (PA) 618. In certain aspects, the BBF 612, the mixer 614, and the DA 616 may be included in a semiconductor device such as a radio frequency integrated circuit (RFIC), whereas the PA 618 may be external to this semiconductor device.

The BBF 612 filters the baseband signals received from the DAC 610, and the mixer 614 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 614 are typically RF signals, which may be amplified by the DA 616 and/or by the PA 618 before transmission by the antenna 606. In certain cases, the BBF 612 may be implemented using an electroacoustic filter with a BAW resonator (e.g., the electroacoustic filter circuit 300).

The RX path 604 may include a low noise amplifier (LNA) 624, a filter 626, a mixer 628, and a baseband filter (BBF) 630. The LNA 624, the filter 626, the mixer 628, and the BBF 630 may be included in a RFIC, which may or may not be the same RFIC that includes the TX path components. RF signals received via the antenna 606 may be amplified by the LNA 624 and filtered by the filter 626, and the mixer 628 mixes the amplified RF signals with a receive local oscillator (LO) signal to convert the RF signal of interest to a different baseband frequency (e.g., downconvert). The baseband signals output by the mixer 628 may be filtered by the BBF 630 before being converted by an analog-to-digital converter (ADC) 632 to digital I or Q signals for digital signal processing. In certain cases, the filter 626 and/or BBF 630 may be implemented using an electroacoustic filter with a BAW resonator (e.g., the electroacoustic filter circuit 300).

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 620, which may be buffered or amplified by amplifier 622 before being mixed with the baseband signals in the mixer 614. Similarly, the receive LO may be produced by an RX frequency synthesizer 634, which may be buffered or amplified by amplifier 636 before being mixed with the RF signals in the mixer 628.

Figure 7:
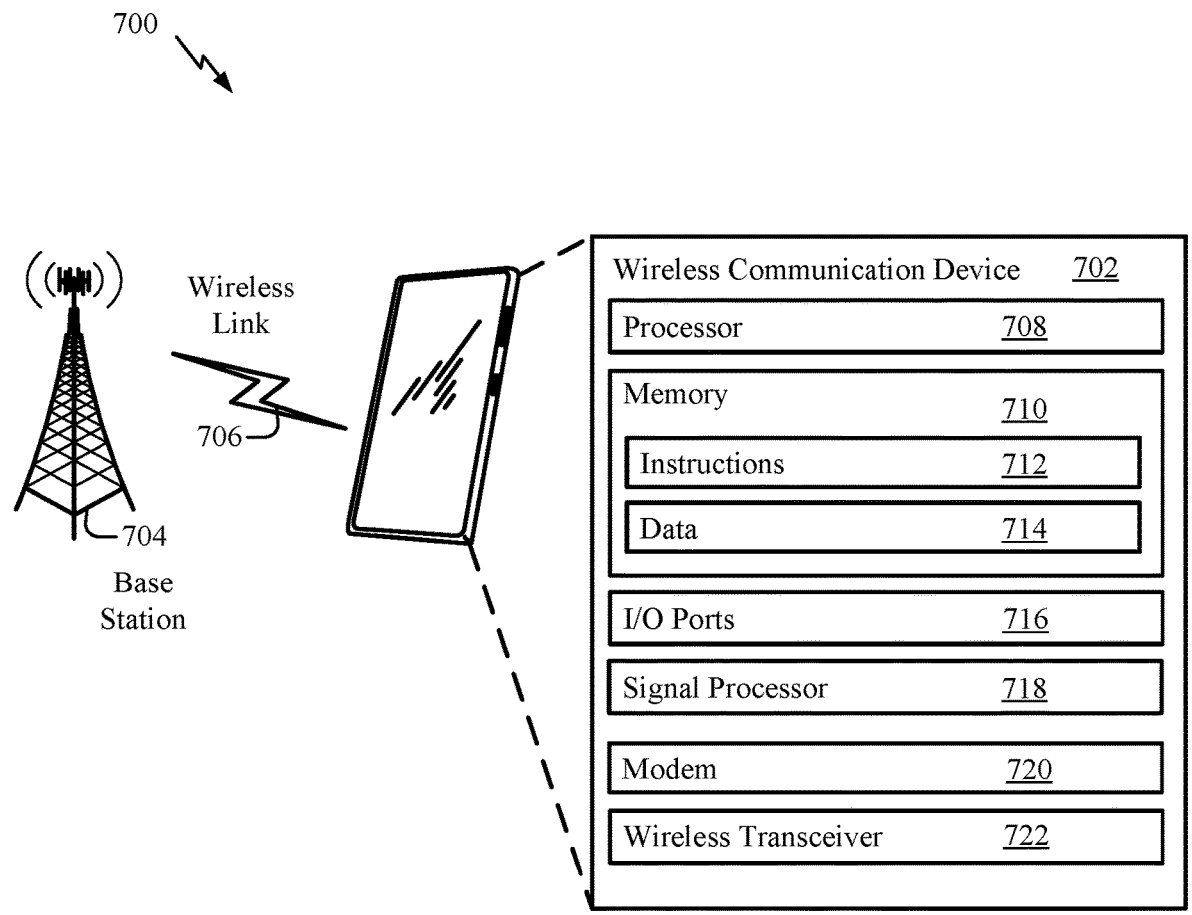
FIG. 7 is a diagram of a wireless communication network that includes a wireless communication device having a transceiver such as the transceiver of FIG. 6, in accordance with certain aspects of the present disclosure.

FIG. 7 is a diagram of an environment 700 that includes a wireless communication device 702, which has a wireless transceiver 722 such as the RF transceiver 600 of FIG. 6. In the environment 700, the wireless communication device 702 communicates with a base station 704 through a wireless link 706. As shown, the wireless communication device 702 is depicted as a smart phone. However, the electronic wireless communication device 702 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 704 communicates with the wireless communication device 702 via the wireless link 706, which may be implemented as any suitable type of wireless link. Although depicted as a base station tower of a cellular radio network, the base station 704 may represent or be implemented as another device, such as a satellite, terrestrial broadcast tower, access point, peer-to-peer device, mesh network node, fiber optic line, another electronic device generally as described above, and so forth. Hence, the wireless communication device 702 may communicate with the base station 704 or another device via a wired connection, a wireless connection, or a combination thereof. The wireless link 706 can include a downlink of data or control information communicated from the base station 704 to the wireless communication device 702 and an uplink of other data or control information communicated from the wireless communication device 702 to the base station 704. The wireless link 706 may be implemented using any suitable communication protocol or standard, such as 3rd Generation Partnership Project Long-Term Evolution (3GPP LTE), 3GPP New Radio Fifth Generation (NR 5G), IEEE 802.11 (WiFi), IEEE 802.16 (WiMAX), Bluetooth™ and so forth.

The wireless communication device 702 includes a processor 708 and a memory 710. The memory 710 may be or form a portion of a computer readable storage medium. The processor 708 may include any type of processor, such as an application processor or a multi-core processor, that is configured to execute processor-executable instructions (e.g., code) stored by the memory 710. The memory 710 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 710 is implemented to store instructions 712, data 714, and other information of the wireless communication device 702, and thus when configured as or part of a computer readable storage medium, the memory 710 does not include transitory propagating signals or carrier waves. That is, the memory 710 may include non-transitory computer-readable media (e.g., tangible media).

The wireless communication device 702 may also include input/output ports 716. The I/O ports 716 enable data exchanges or interaction with other devices, networks, or users or between components of the device.

The wireless communication device 702 may further include a signal processor (SP) 718 (e.g., such as a digital signal processor (DSP)). The signal processor 718 may function similar to the processor 708 and may be capable of executing instructions and/or processing information in conjunction with the memory 710.

For communication purposes, the wireless communication device 702 also includes a modem 720, a wireless transceiver 722, and an antenna (not shown). The wireless transceiver 722 provides connectivity to respective networks and other wireless communication devices connected therewith using radio-frequency (RF) wireless signals and may include the RF transceiver 600 of FIG. 6. The wireless transceiver 722 may facilitate communication over any suitable type of wireless network, such as a wireless local area network (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 8:
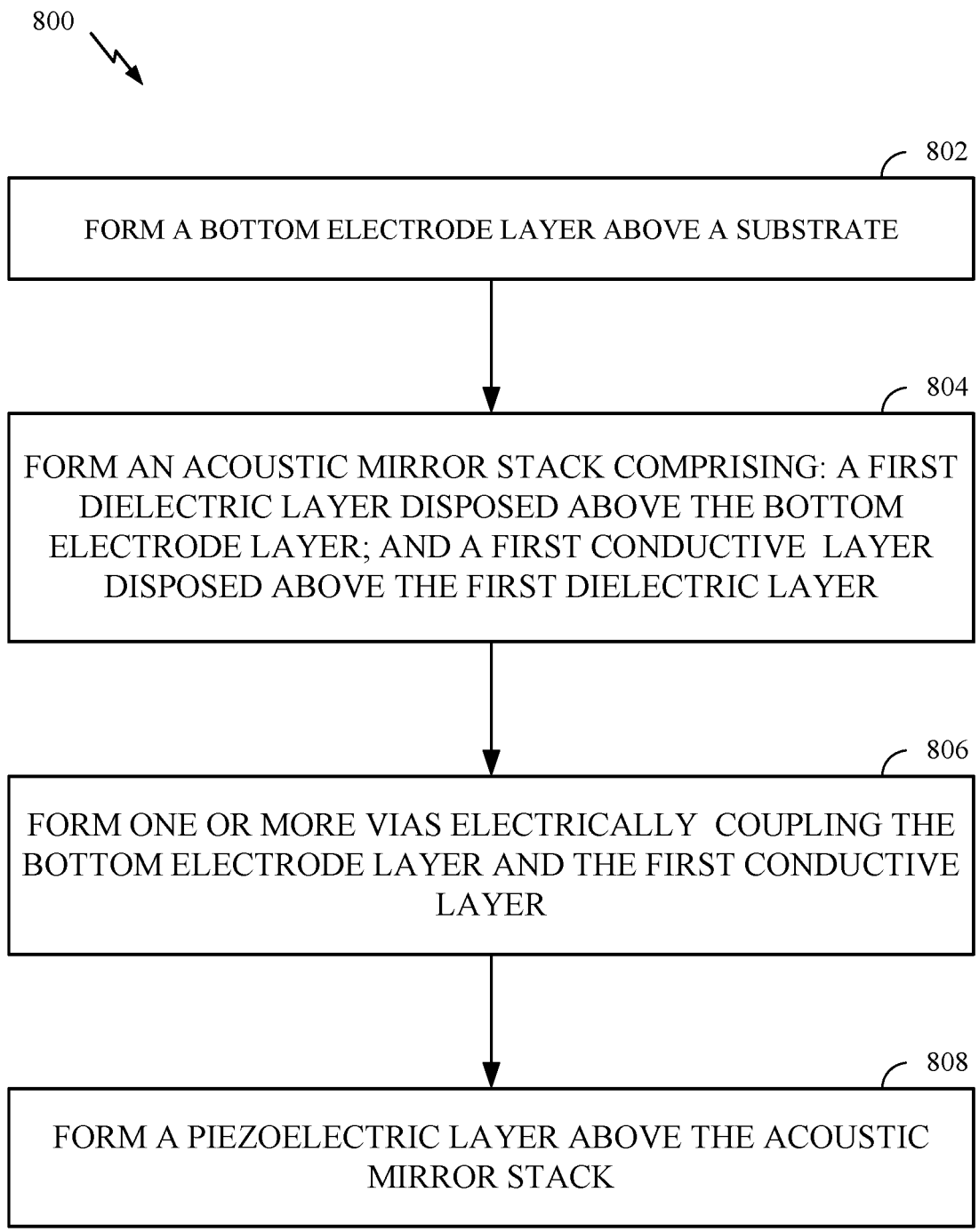
FIG. 8 is a flow diagram illustrating example operations for fabricating an electroacoustic device, in accordance with certain aspects of the present disclosure.

FIG. 8 is a flow diagram illustrating example operations 800 for fabricating an electroacoustic device, in accordance with certain aspects of the present disclosure. The operations 800 may be performed, for example, by a fabrication facility.

The operations 800 may begin, at block 802, with the fabrication facility forming a bottom electrode layer (e.g., electrode structure 106) above a substrate. At block 804 the fabrication facility forms an acoustic mirror stack including a first dielectric layer (e.g., reflector layer 122) disposed above the bottom electrode layer, and a first conductive layer (e.g., reflector layer 120) disposed above the first dielectric layer. At block 806, the fabrication facility forms one or more vias (e.g., vias 212, 214, 216) electrically coupling the bottom electrode layer and the first conductive layer, and at block 808, forms a piezoelectric layer (e.g., piezoelectric layer 104) above the acoustic mirror stack.

Example Aspects

Aspect 1. An electroacoustic device, comprising: a substrate; a bottom electrode layer disposed above the substrate; an acoustic mirror stack having a first dielectric layer disposed above the bottom electrode layer, and a first conductive layer disposed above the first dielectric layer; a piezoelectric layer disposed above the acoustic mirror stack; and one or more first vias disposed between the bottom electrode layer and the first conductive layer, the one or more first vias electrically coupling the bottom electrode layer and the first conductive layer.

Aspect 2. The electroacoustic device of Aspect 1, further comprising a top electrode layer disposed above the piezoelectric layer.

Aspect 3. The electroacoustic device of any of Aspects 1-2, wherein the acoustic mirror stack further comprises: one or more second dielectric layers disposed above the bottom electrode layer; one or more second conductive layers, each disposed above a respective one of the one or more second dielectric layers; and one or more second vias disposed between the first conductive layer and a respective one of the one or more second conductive layers, the one or more second vias electrically coupling the first conductive layer and the respective one of the one or more second conductive layers.

Aspect 4. The electroacoustic device of Aspect 3, wherein the piezoelectric layer is in direct contact with an uppermost conductive layer of the one or more second conductive layers.

Aspect 5. The electroacoustic device of any of Aspects 1-2, wherein the piezoelectric layer is in direct contact with the first conductive layer.

Aspect 6. The electroacoustic device of any of Aspects 1-2 and 5, further comprising a third conductive layer coupled between the bottom electrode layer and the first dielectric layer.

Aspect 7. The electroacoustic device of any of Aspects 1-6, wherein the first dielectric layer comprises silicon dioxide ($SiO_2$).

Aspect 8. The electroacoustic device of any of Aspects 1-7, wherein the first conductive layer comprises tungsten (W).

Aspect 9. The electroacoustic device of any of Aspects 1-8, wherein the one or more first vias comprise tungsten (W) or molybdenum (Mo).

Aspect 10. The electroacoustic device of any of Aspects 1-2 and 5-9, further comprising a third dielectric layer between the substrate and the bottom electrode layer.

Aspect 11. The electroacoustic device of any of Aspects 1-10, wherein the electroacoustic device is configured as a bulk acoustic wave (BAW) resonator.

Aspect 12. A radio frequency (RF) filter comprising the electroacoustic device of any of Aspects 1-11.

Aspect 13. The electroacoustic device of any of Aspects 1-12, wherein a thickness of the bottom electrode layer is greater than 100 nanometers.

Aspect 14. A method for signal processing, comprising receiving a signal at a terminal of an electroacoustic device, and processing the signal via the electroacoustic device, wherein the electroacoustic device comprises: a substrate; a bottom electrode layer disposed above the substrate; an acoustic mirror stack having a first dielectric layer disposed above the bottom electrode layer, and a first conductive layer disposed above the first dielectric layer; a piezoelectric layer disposed above the acoustic mirror stack; and one or more first vias disposed between the bottom electrode layer and the first conductive layer, the one or more first vias electrically coupling the bottom electrode layer and the first conductive layer.

Aspect 15. The method of Aspect 14, wherein the terminal of the electroacoustic device comprises the bottom electrode layer.

Aspect 16. The method of Aspect 14, wherein the electroacoustic device further comprises a top electrode layer disposed above the piezoelectric layer, the terminal of the electroacoustic device comprising the top electrode layer.

Aspect 17. The method of any of Aspects 14-16, wherein the acoustic mirror stack further comprises: one or more second dielectric layers disposed above the bottom electrode layer; one or more second conductive layers, each disposed above a respective one of the one or more second dielectric layers; and one or more second vias disposed between the first conductive layer and a respective one of the one or more second conductive layers, the one or more second vias electrically coupling the first conductive layer and the respective one of the one or more second conductive layers.

Aspect 18. The method of Aspect 17, wherein the piezoelectric layer is in direct contact with an uppermost conductive layer of the one or more second conductive layers.

Aspect 19. The method of any of Aspects 14-16, wherein the piezoelectric layer is in direct contact with the first conductive layer.

Aspect 20. The method of any of Aspects 14-16 and 19, wherein the electroacoustic device further comprises a third conductive layer coupled between the bottom electrode layer and the first dielectric layer.

Aspect 21. The method of any of Aspects 14-20, wherein the first dielectric layer comprises silicon dioxide ($SiO_2$).

Aspect 22. The method of any of Aspects 14-21, wherein the first conductive layer comprises tungsten (W).

Aspect 23. The method of any of Aspects 14-22, wherein the one or more first vias comprise tungsten (W) or molybdenum (Mo).

Aspect 24. The method of any of Aspects 14-16 and 19-23, wherein the electroacoustic device further comprises a third dielectric layer between the substrate and the bottom electrode layer.

Aspect 25. The method of any of Aspects 14-24, wherein the electroacoustic device is configured as a bulk acoustic wave (BAW) resonator.

Aspect 26. The method of any of Aspects 14-25, wherein a thickness of the bottom electrode layer is greater than 100 nanometers.

Aspect 27. A method of fabricating an electroacoustic device, comprising: forming a bottom electrode layer above a substrate; forming an acoustic mirror stack comprising a first dielectric layer disposed above the bottom electrode layer, and a first conductive layer disposed above the first dielectric layer; forming one or more vias electrically coupling the bottom electrode layer and the first conductive layer; and forming a piezoelectric layer above the acoustic mirror stack.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components.

The following description provides examples of an electroacoustic device for various filtering applications, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware components. Generally, where there are operations illustrated in figures, those operations may have corresponding counterpart means-plus-function components with similar numbering.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An electroacoustic device, comprising:
 a substrate;
 a bottom electrode layer disposed above the substrate;
 an acoustic mirror stack having:
  a first dielectric layer disposed above the bottom electrode layer; and
  a first conductive layer disposed above the first dielectric layer;
 a piezoelectric layer disposed above the acoustic mirror stack; and
 one or more first vias disposed between the bottom electrode layer and the first conductive layer, the one or more first vias electrically coupling the bottom electrode layer and the first conductive layer.

2. The electroacoustic device of claim 1, further comprising a top electrode layer disposed above the piezoelectric layer.

3. The electroacoustic device of claim 1, wherein the acoustic mirror stack further comprises:
 one or more second dielectric layers disposed above the bottom electrode layer;
 one or more second conductive layers, each disposed above a respective one of the one or more second dielectric layers; and
 one or more second vias disposed between the first conductive layer and a respective one of the one or more second conductive layers, the one or more second vias electrically coupling the first conductive layer and the respective one of the one or more second conductive layers.

4. The electroacoustic device of claim 3, wherein the piezoelectric layer is in direct contact with an uppermost conductive layer of the one or more second conductive layers.

5. The electroacoustic device of claim 1, wherein the piezoelectric layer is in direct contact with the first conductive layer.

6. The electroacoustic device of claim 1, further comprising a second conductive layer coupled between the bottom electrode layer and the first dielectric layer.

7. The electroacoustic device of claim 1, wherein the first dielectric layer comprises silicon dioxide ($SiO_2$).

8. The electroacoustic device of claim 1, wherein the first conductive layer comprises tungsten (W).

9. The electroacoustic device of claim 1, wherein the one or more first vias comprise tungsten (W) or molybdenum (Mo).

10. The electroacoustic device of claim 1, further comprising a second dielectric layer between the substrate and the bottom electrode layer.

11. The electroacoustic device of claim 1, wherein the electroacoustic device is configured as a bulk acoustic wave (BAW) resonator.

12. A radio frequency (RF) filter comprising the electroacoustic device of claim 1.

13. The electroacoustic device of claim 1, wherein a thickness of the bottom electrode layer is greater than 100 nanometers.

14. A method for signal processing, comprising:
 receiving a signal at a terminal of an electroacoustic device; and
 processing the signal via the electroacoustic device, wherein the electroacoustic device comprises:
  a substrate;
  a bottom electrode layer disposed above the substrate;
  an acoustic mirror stack having:
   a first dielectric layer disposed above the bottom electrode layer; and
   a first conductive layer disposed above the first dielectric layer;
  a piezoelectric layer disposed above the acoustic mirror stack; and
  one or more first vias disposed between the bottom electrode layer and the first conductive layer, the one or more first vias electrically coupling the bottom electrode layer and the first conductive layer.

15. The method of claim 14, wherein the terminal of the electroacoustic device comprises the bottom electrode layer.

16. The method of claim 14, wherein the electroacoustic device further comprises a top electrode layer disposed above the piezoelectric layer, the terminal of the electroacoustic device comprising the top electrode layer.

17. The method of claim 14, wherein the acoustic mirror stack further comprises:
one or more second dielectric layers disposed above the bottom electrode layer;
one or more second conductive layers, each disposed above a respective one of the one or more second dielectric layers; and
one or more second vias disposed between the first conductive layer and a respective one of the one or more second conductive layers, the one or more second vias electrically coupling the first conductive layer and the respective one of the one or more second conductive layers.

18. The method of claim 17, wherein the piezoelectric layer is in direct contact with an uppermost conductive layer of the one or more second conductive layers.

19. The method of claim 14, wherein the piezoelectric layer is in direct contact with the first conductive layer.

20. The method of claim 14, wherein the electroacoustic device further comprises a second conductive layer coupled between the bottom electrode layer and the first dielectric layer.

21. The method of claim 14, wherein the first dielectric layer comprises silicon dioxide ($SiO_2$).

22. The method of claim 14, wherein the first conductive layer comprises tungsten (W).

23. The method of claim 14, wherein the one or more first vias comprise tungsten (W) or molybdenum (Mo).

24. The method of claim 14, wherein the electroacoustic device further comprises a second dielectric layer between the substrate and the bottom electrode layer.

25. The method of claim 14, wherein the electroacoustic device is configured as a bulk acoustic wave (BAW) resonator.

26. The method of claim 14, wherein a thickness of the bottom electrode layer is greater than 100 nanometers.

27. A method of fabricating an electroacoustic device, comprising:
forming a bottom electrode layer above a substrate;
forming an acoustic mirror stack comprising:
a first dielectric layer disposed above the bottom electrode layer; and
a first conductive layer disposed above the first dielectric layer;
forming one or more vias electrically coupling the bottom electrode layer and the first conductive layer; and
forming a piezoelectric layer above the acoustic mirror stack.

* * * * *